US010867769B2

(12) United States Patent
Ideno et al.

(10) Patent No.: US 10,867,769 B2
(45) Date of Patent: Dec. 15, 2020

(54) VACUUM APPARATUS AND CHARGED PARTICLE BEAM WRITING APPARATUS

(71) Applicant: NuFlare Technology, Inc., Yokohama (JP)

(72) Inventors: Keita Ideno, Yokosuka (JP); Tetsuro Nishiyama, Yokohama (JP); Hiroyasu Saito, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 19 days.

(21) Appl. No.: 16/427,997

(22) Filed: May 31, 2019

(65) Prior Publication Data

US 2019/0371567 A1 Dec. 5, 2019

(30) Foreign Application Priority Data

Jun. 4, 2018 (JP) ................. 2018-107009

(51) Int. Cl.
*H01J 37/16* (2006.01)
*H01J 37/20* (2006.01)
*H01J 37/317* (2006.01)

(52) U.S. Cl.
CPC ............. *H01J 37/16* (2013.01); *H01J 37/20* (2013.01); *H01J 37/3174* (2013.01); *H01J 2237/002* (2013.01); *H01J 2237/1825* (2013.01)

(58) Field of Classification Search
CPC ........ H01J 37/16; H01J 37/20; H01J 37/3174; H01J 2237/002; H01J 2237/1825
See application file for complete search history.

(56) References Cited

FOREIGN PATENT DOCUMENTS

JP 2007-311621 11/2007

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

A vacuum apparatus according to an embodiment includes a chamber configured air-tightly, a vacuum pump configured to exhaust gas from the chamber, and an exhaustion structure placed between the chamber and an inlet port of the vacuum pump and having a ventilation path surrounded by a wall of the exhaustion structure. The vacuum pump exhausts gas from the chamber through the ventilation path of the exhaustion structure. A layer of thermal energy absorbing material is formed on at least part of an inner surface of the wall of the exhaustion structure to absorb energy of thermal radiation emitted from the inlet port of the vacuum pump.

10 Claims, 6 Drawing Sheets

VACUUM APPARATUS AND CHARGED PARTICLE BEAM WRITING APPARATUS

CROSS-REFERENCE TO RELATED APPLICATION

This application is based upon and claims the benefit of priority from Japanese Patent Application No. 2018-107009, filed Jun. 4, 2018, the entire contents of which are incorporated herein by reference.

FIELD

Embodiments described herein relate generally to a vacuum apparatus that processes a target object under vacuum environment and a charged particle beam writing apparatus that writes a pattern to a target object using one or more charged particle beams under vacuum environment.

BACKGROUND

A vacuum apparatus includes a chamber evacuated by exhausting its internal gas by a vacuum pump. In the vacuum apparatus, various processes are performed for a target object placed under vacuum environment in the chamber. The vacuum apparatus may include a charged particle beam writing apparatus that is used to write a predetermined pattern on a target object (e.g. a wafer on which a semiconductor pattern is formed and a reticle or a mask used to transfer a pattern onto a wafer) using a charged particle beam (e.g. an electron beam) and a vacuum deposition apparatus that is used to form a thin film on a target object by vapor deposition under vacuum environment. For example, the charged particle beam writing apparatus generally uses a turbo-molecular pump (TMP) as a vacuum pump in order to produce an ultrahigh vacuum without oil. The turbo-molecular pump includes a rotor with metallic turbine blades. When the rotor rotates at high speed, the metallic turbine blades hit the molecules of gas from the inlet port towards the exhaust port to exhaust the gas.

In the turbo-molecular pump, the rotor is heated by, e.g. heat generated by friction between the gas molecules and the turbine blades that rotate at high speed. Since the inlet port is located above the rotor in the turbo-molecular pump, a cooling mechanism cannot be provided for the rotor in the upper portion of the turbo-molecular pump. The heated rotor thus emits thermal radiation. The thermal radiation is transferred to a chamber to which the turbo-molecular pump is attached, thus increasing the temperature of a target object placed in the chamber and that of a structure that supports a target object. As a result, the increase in temperature creates a non-uniform distribution of temperatures over the surface of the target object, and the target object is inaccurately processed. For example, in the charged particle beam writing apparatus, a non-uniform temperature distribution partly expands or contracts a mask or wafer and thus the accuracy of patterns written on the mask or wafer is degraded.

JP-A-2007-311621 discloses an example of a solution to the above-described issue. In this example, in a chamber, a first shield plate whose emissivity is low is provided in front of the inlet port of a turbo-molecular pump. In the chamber, a second shield plate whose emissivity is high is provided to surround the inlet port of the turbo-molecular pump and the first shield plate. The second shield plate whose emissivity is high absorbs thermal radiation reflected by the first shield plate whose emissivity is low. Heat generated from the second shield plate is cooled using a coolant.

When the first shield plate is placed close to the inlet port, it reflects thermal radiation with efficiency. Since, however, the first and second shield plates increase exhaust resistance (or decrease conductance), the vacuum of the chamber does not reach a desired value, and exhaust time required until the vacuum reaches a desired value is lengthened. Conversely, when the first shield plate is placed at a distant location from the inlet port to prevent conductance from decreasing, the capability of reflecting the thermal radiation from the inlet port lowers. Furthermore, the structure formed by the first and second shield plates deeply projects in the chamber. In addition, since the second shield plate with a cooling mechanism is placed in the chamber where a target object is processed, the chamber is increased in size. As the number of structures provided in the chamber increases, the area over which reaction products can be attached increases when the reaction products are produced in the processing of a target object. Accordingly, the probability of contaminating the processing environment in the chamber increases.

SUMMARY

An embodiments of the present invention provides a vacuum apparatus which is capable of absorbing energy of thermal radiation emitted from a vacuum pump and reducing thermal radiation, which is transmitted to a chamber from the vacuum pump, without adding a structure into the chamber.

A vacuum apparatus according to one embodiment includes a chamber, a vacuum pump configured to evacuate the chamber, and an exhaustion structure placed between the chamber and an inlet port of the vacuum pump and having a ventilation path surrounded by a wall of the exhaustion structure. The vacuum pump exhausts gas from the chamber through the ventilation path of the exhaustion structure. A layer of thermal energy absorbing material is formed on at least part of an inner surface of the wall of the exhaustion structure to absorb energy of the thermal radiation emitted from the inlet port of the vacuum pump.

The vacuum apparatus may be a charged particle beam writing apparatus.

DETAILED DESCRIPTION

Embodiments of the present invention will be described below in detail with reference to the accompanying drawings.

Figure 1:
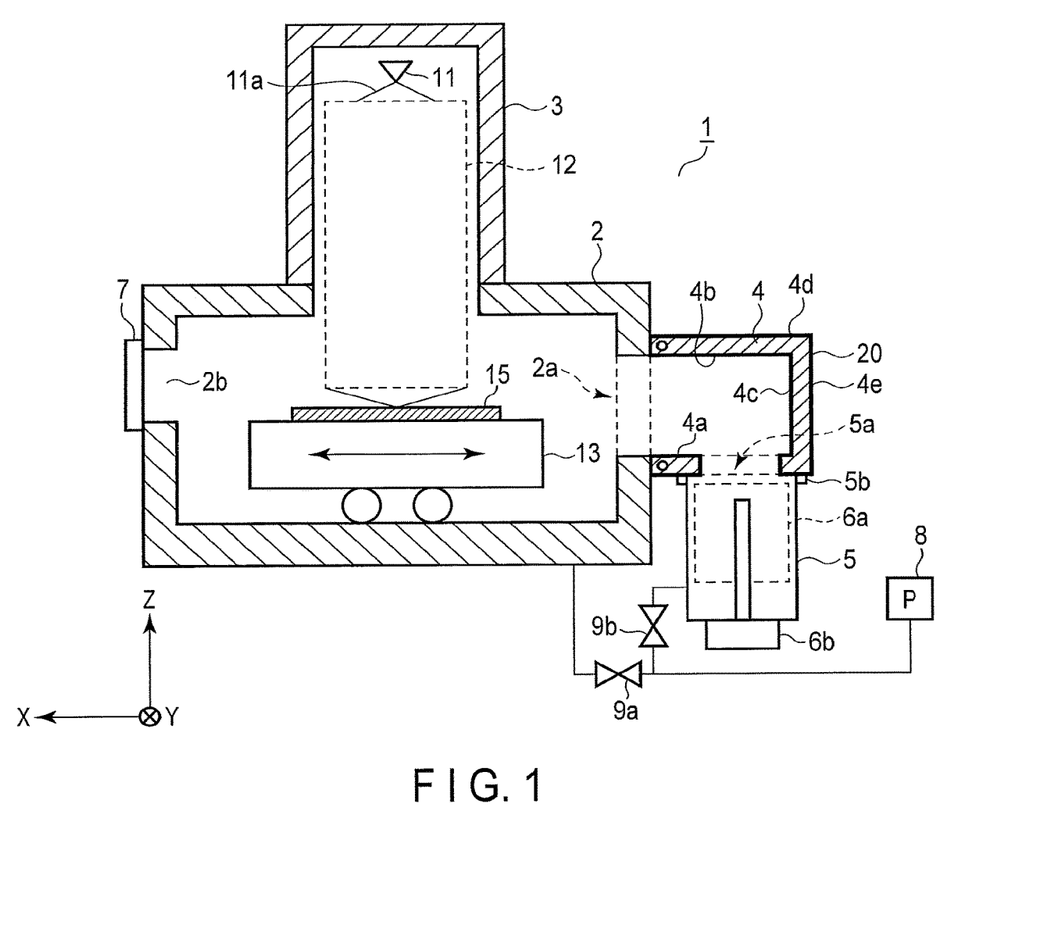
FIG. 1 schematically illustrates a configuration of an electron beam writing apparatus according to a first embodiment.
Figure 2:
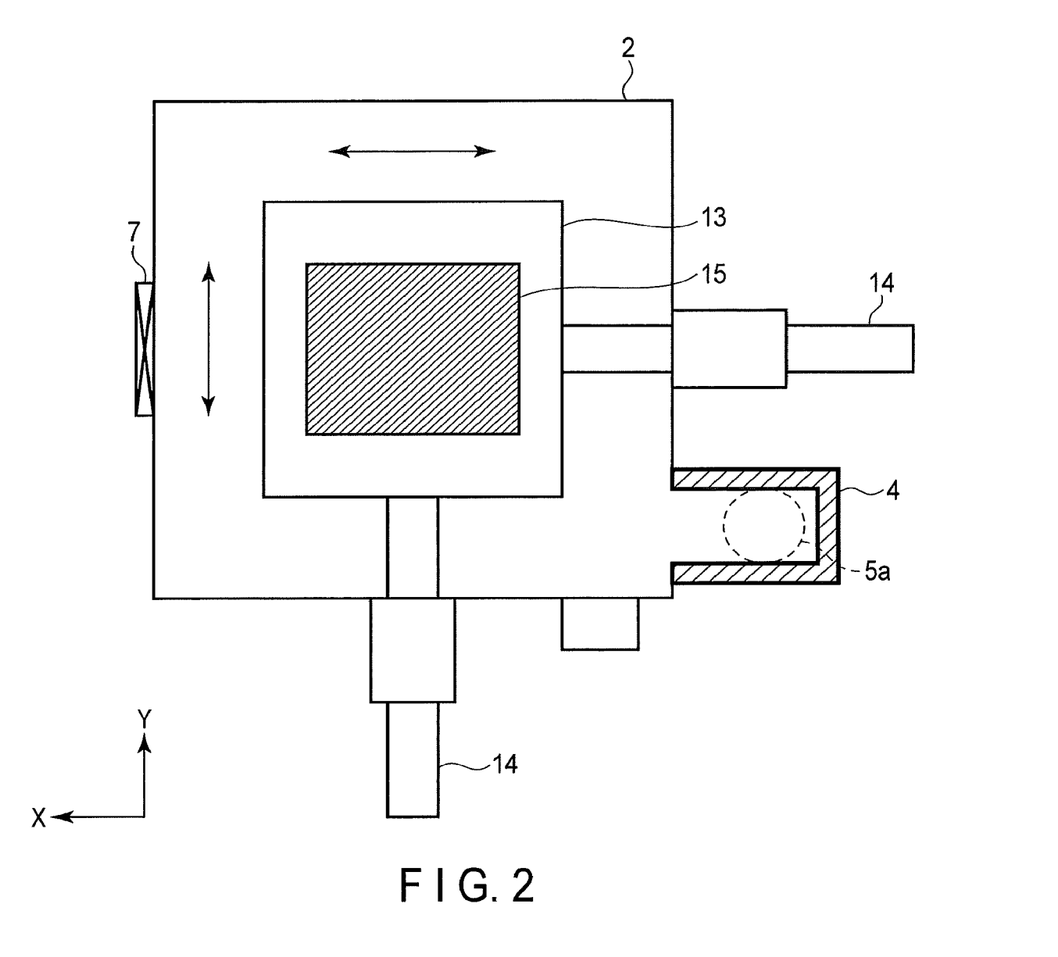
FIG. 2 schematically illustrates an example of arrangement of relevant components in the electron beam writing apparatus according to the first embodiment, which is viewed from above.

FIG. 1 schematically shows a configuration of an electron beam writing apparatus which is an example of a vacuum apparatus equipped with a vacuum pump according to an embodiment. FIG. 2 schematically illustrates the arrangement of components associated with a chamber of the electron beam writing apparatus according to this embodiment, as viewed from above. The vacuum apparatus is not limited to the electron beam writing apparatus, but may be any apparatus in which a target object is processed under vacuum environment, such as a film deposition apparatus and an etching apparatus. The electron beam writing apparatus may also be an apparatus that writes using a charged particle beam other than the electron beam.

First Embodiment

The electron beam writing apparatus 1 according to a first embodiment will be described with reference to FIGS. 1 and 2. The electron beam writing apparatus 1 includes a chamber 2, also referred to as a mask writing chamber, in which a mask 15 for writing is placed and an electron beam optical column 3 provided on the chamber 2. The mask 15 is one example of the target object. The electron beam writing apparatus 1 also includes components (not shown) in FIGS. 1 and 2, such as a controller and a power supply. The chamber 2 is air-tightly formed of metal such as an aluminum alloy and a stainless alloy such that it can be maintained under vacuum, and is shaped like a hollow box. The chamber 2 has an opening 2b on its side to take in and out the mask 15, and a gate 7 openably provided to cover the opening 2b air-tightly. A mask transportation mechanism that is configured to transport the mask 15 to the chamber 2 is coupled to the gate 7. The mask transportation mechanism is omitted from FIGS. 1 and 2 for brevity of description.

The chamber 2 includes a stage 13 on which the mask 15 is placed. The stage 13 is configured to be movable within an X-Y plane by use of a stage driving mechanism 14. The stage driving mechanism 14 is provided, for example, in each of X and Y directions to apply a driving force to the stage 13 in the X and Y directions. For example, the stage driving mechanism 14 may include a motor, a rod that applies a driving force to the stage 13, a roller that is rotated by the motor to transfer a driving force to the rod by friction between the roller and the rod. The stage driving mechanism 14 moves the stage 13 to write a pattern in a desired position of the mask 15. Note that the stage 13 may have a driving mechanism that moves the stage 13 in the height direction (Z direction). When the gate 7 is opened, the mask 15 is transported by the mask transportation mechanism and placed on the stage 13.

The electron beam optical column 3 includes an electron beam irradiation optical system 12. The electron beam irradiation optical system 12, the details of which are not shown, may include an electron gun 11 that emits an electron beam, a plurality of lenses, a plurality of aperture members to shape the section of an electron beam, and a plurality of deflectors to deflect an electron beam. The plurality of lenses may include an illumination lens, a projection lens and an objective lens. The optical system 12 shapes, deflects and scans the electron beam emitted from the electron gun 11 to irradiate the mask 15 with a desired electron beam. While the stage 13 is moving, the mask 15 is irradiated with the electron beam to write a desired pattern on the mask 15. The mask 15 may include a substrate of quartz and a layer of light-shielding material such as chromium, on which a pattern is written.

An exhaustion opening 2a is formed on one side of the chamber 2 of the electron beam writing apparatus 1 to exhaust gas from the chamber 2. A box-shaped bracket exhaustion structure 4 is air-tightly attached to the chamber 2 to cover the exhaustion opening 2a. The exhaustion structure 4 includes a ventilation path formed air-tightly by the wall thereof. The wall of the exhaustion structure 4 is formed of metal material whose thermal conductivity is high, such as an aluminum alloy and a copper alloy. For example, the wall of the exhaustion structure 4 forms a hollow box. If the design values required for rigidity and strength are satisfied, the wall of the exhaustion structure 4 may be formed of aluminum and copper in place of the aluminum alloy and copper alloy.

The exhaustion structure 4 has an opening for a vacuum pump on its bottom. In the first embodiment, a turbo-molecular pump (TMP) 5 is used as the vacuum pump. The TMP 5 is one example of the vacuum pump. The vacuum pump may be a mechanical pump that emits thermal radiation when it is driven. The TMP 5 is attached to the exhaustion structure 4 such that its inlet port 5a aligns with the opening of the exhaustion structure 4. The TMP 5 includes an inlet flange 5b around the inlet port 5a. A seal member (not shown) is provided between the wall of the exhaustion structure 4 and the inlet flange 5b. The TMP 5 is air-tightly attached to the wall of the exhaustion structure 4 by means of a bolt. The wall of the exhaustion structure 4 includes a high-emissivity layer on at least its inner surface, favorably on each of the inner and outer surfaces. FIG. 1 illustrates the inner surface 4a of the bottom wall of the exhaustion structure 4, the inner surface 4b and outer surface 4d of the upper wall thereof, and the inner surface 4c and outer surface 4e of the side wall thereof.

The TMP 5 includes a rotor 6a with turbine blades in its upper part and a motor 6b to rotate the rotor 6a in its lower part. The TMP 5 may include a cooling mechanism in its lower part. In the TMP 5, the rotor 6a is heated by, e.g. heat generated by friction between the turbine blades rotating at high speed and the molecules of gas. The heated rotor 6a emits thermal radiation. As will be described later, the thermal radiation is transferred to the exhaustion structure 4 through the inlet port of the TMP 5.

The electron beam writing apparatus 1 further includes a dry pump 8 to perform back pressure exhaust for the TMP and evacuate the chamber 2 from atmospheric pressure to a low vacuum. In addition, a valve 9a is provided in an exhaust line extending from the chamber 2 to the dry pump 8, and a valve 9b is provided in an exhaust line extending from the back pressure exhaust side of the TMP 5 to the dry pump 8. One of these valves 9a and 9b is selected to exhaust gas through its corresponding one of the exhaust lines.

Figure 3:
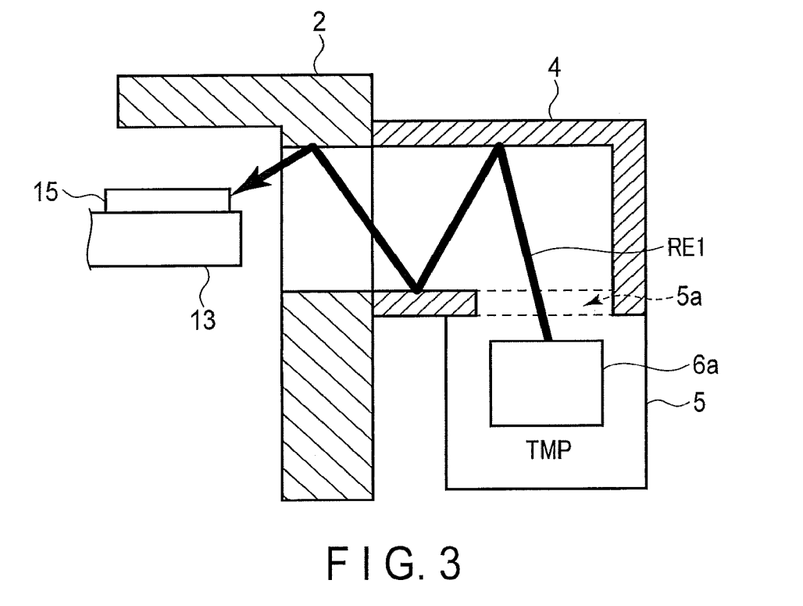
FIG. 3 conceptually shows the expected propagation of thermal radiation emitted from the inlet port of a turbo-molecular pump.

FIG. 3 illustrates, as a reference example, a flow of radiation emitted from the TMP 5 in a case where there is no high-emissivity layer on the inner surface of the wall of the exhaustion structure 4.

For example, as shown in FIG. 3, thermal radiation RE1 emitted from the rotor 6a rotating at high speed moves into the exhaustion structure 4 from the inlet port 5a formed in the upper part of the TMP 5, and enters the inner surface 4b of the upper wall of the exhaustion structure 4. The thermal radiation RE1 propagates while it is reflected by the inner surface 4b of the upper wall of the exhaustion structure 4, the inner surface 4a of the lower wall thereof and the exhaustion opening 2a of the chamber 2 in that order, and then reaches and enters the chamber 2. In the case where the inner surface of the wall of the exhaustion structure 4 is formed of low-emissivity material, the absorptivity at which the energy of thermal radiation that has reached the wall of the exhaustion structure 4 is absorbed by the wall is low (emissivity c and absorptivity a of an object are considered to be equal by the Kirchhoff's laws). Thus, the thermal radiation that is incident upon the inner surface 4b of the upper wall of the exhaustion structure 4 is reflected by the inner surface 4b without attenuating the amount of energy. Since the thermal radiation is reflected by the inner surface 4a of the lower wall of the exhaustion structure 4 in the same manner, the energy of thermal radiation attenuated until the thermal radiation reaches into the chamber 2 is small. The thermal radiation whose energy attenuation is small reaches the stage 13 and mask 15 in the chamber 2. The mask 15 placed on the stage 13 is thus more influenced by the thermal radiation from the inlet port 5a of the TMP 5 as the mask is placed closer to the exhaustion opening 2a.

Figure 4:
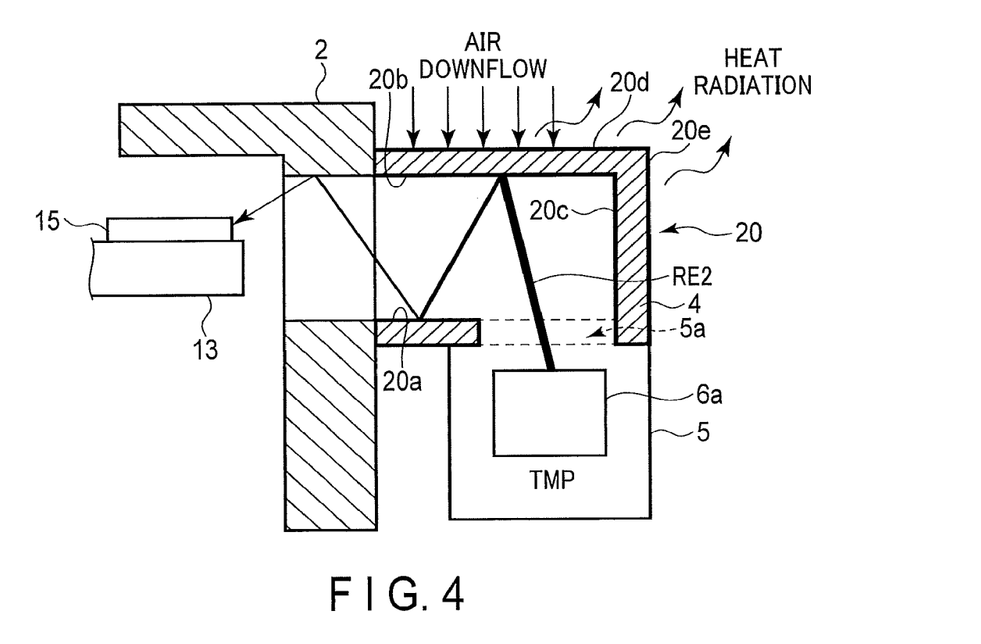
FIG. 4 conceptually shows the propagation of thermal radiation from an inlet port of the turbo-molecular pump to a chamber through an exhaustion structure in the electron beam writing apparatus according to the first embodiment.

Next a description is made with respect to transfer of thermal radiation in the electron beam writing apparatus 1 according to the first embodiment. As described above, in the electron beam writing apparatus 1 of the first embodiment, a layer of high-emissivity material is formed on at least the inner surface of the wall of the exhaustion structure 4. FIG. 4 illustrates a flow of transfer of thermal radiation from the inlet port 5a of the TMP 5 into the chamber 2 in the electron beam writing apparatus 1 of the first embodiment.

In the electron beam writing apparatus 1 according to the first embodiment, the wall of the exhaustion structure 4 is formed of metal material whose thermal conductivity is high and also includes a high-emissivity, conductive layer 20 formed by film deposition on its surface. The metal material of the exhaustion structure 4 may favorably be an aluminum alloy or copper alloy of high thermal conductivity. However, the wall of the exhaustion structure 4 is required to have rigidity and strength sufficient to withstand the vacuum pressure generated by the TMP 5. The rigidity and strength of the exhaustion structure 4 can also be obtained by adjusting the thickness of the wall or providing a reinforcement structure such as a rib structure.

The exhaustion structure 4 includes the layer 20 of high-emissivity material at least on the inner surface of the wall or on the inner and outer surfaces thereof. The high-emissivity material may be a black chromium oxide, a black chrome and the like. As a method of forming the layer, for example, electrolytic plating, black chrome plating, electroless plating, low-temperature chrome plating, spray application, and deposition may be used. In addition, an anodized aluminum layer may be formed on the surface of the wall of the exhaustion structure 4 by alumite processing. Note that the anodized aluminum layer is an oxide layer formed on the surface of aluminum and has insulation properties. Thus, the anodized aluminum layer may take electric charges. It is therefore likely that in a vacuum apparatus which employs a charged particle beam such as an electron beam, the electric charges stored in the anodized aluminum layer will influence the charged particle beam. The exhaustion structure having the anodized aluminum layer is not favorable for the charged particle beam writing apparatus such as an electron beam writing apparatus. However, the exhaustion structure having the anodized aluminum layer can be used in a vacuum apparatus (e.g. sputtering apparatus) which does not use a charged particle beam.

As illustrated in FIG. 4, the energy of thermal radiation emitted by heat of the rotor 6a of the TMP 5 and the like propagates in the upward direction of the exhaustion structure 4 through the inlet port 5a of the TMP 5. The propagation of thermal radiation RE2 is illustrated in FIG. 4 by way of example. The thermal radiation RE21 that propagates from the rotor 6a through the inlet port 5a is incident upon a layer 20b formed on the inner surface of the upper wall of the exhaustion structure 4 and opposed to the inlet port 5a. Then, the thermal radiation RE2 is reflected by the layer 20b. The energy of the thermal radiation RE2 is absorbed by the amount corresponding to the emissivity of the layer 20b. Accordingly, the amount of energy of the thermal radiation RE2 reflected by the layer 20b decreases.

The thermal radiation RE2 reflected by the layer 20b is incident upon a layer 20a formed on the bottom wall of the exhaustion structure 4 and is reflected by the layer 20a. The energy of this thermal radiation RE2 is also absorbed by the amount corresponding to the emissivity of the layer 20a. Accordingly, the amount of energy of the thermal radiation RE2 reflected by the layer 20a decreases further. As has been described, the energy of the thermal radiation RE2 emitted from the rotor of the TMP 5 is attenuated as the thermal radiation RE2 is reflected multiple times by the high-permissive layer which is formed on the inner surface of the wall of the exhaustion structure 4. Thus, the energy of thermal radiation RE2 that enters the chamber 2 is small. In other words, since the thermal radiation whose energy amount is reduced enters the chamber 2, the amount of heat generated in the chamber 2 is small.

In the exhaustion structure 4, the energy of thermal radiation RE2 absorbed by the layers 20a and 20b formed on the inner surface of the wall is conducted as heat to the outer surface (indicated by, e.g. 20d) of the wall. The heat of the outer surface of the wall of the exhaustion structure 4 is dissipated to the atmosphere. For example, the electron beam writing apparatus 1 includes a fan to cool the apparatus to by generating a flow of gas within the apparatus. The exhaustion structure 4 may be cooled by blowing the gas to the outer surface of the wall of the exhaustion structure 4. In addition, for example, the electron beam writing apparatus 1 may be installed in a clean room of the semiconductor fabrication line. The temperature of the clean room is controlled. A downflow of gas is generated toward the floor of the room from the ceiling thereof in order to drop the particles of contaminants onto the floor. A portion of the exterior panel of the electron beam writing apparatus 1 is removed, or alternatively, an opening may be formed in the exterior panel. It causes a downflow around the exhaustion structure 4 to cool the wall of the exhaustion structure 4. Using the downflow, the heat of the wall of the exhaustion structure 4 is dissipated from the entire outer surface of the wall. Since, therefore, the electron beam writing apparatus 1 does not require a liquid cooling device which uses a coolant, it is possible to prevent the apparatus from increasing in its installation area, power consumption and costs.

According to the first embodiment, since the energy of thermal radiation generated from the TMP 5 is attenuated in the exhaustion structure 4, the interior temperature of the chamber 2 is prevented from increasing. The influence of the thermal radiation of the TMP 5 upon the mask 15 and the stage 13 is therefore suppressed. Since a difference in temperature due to the position of the mask 15 onto which a pattern is being written in the chamber 2 is small, a difference in temperature due to the position in the surface of the mask 15 placed on the stage 13 can be lessened. This improves the accuracy of the position in the surface of the mask 15 at which a pattern is written.

Note that when the layer 20 formed on the surface of the wall of the exhaustion structure 4 is formed of conductive materials, it can prevent the layer 20 from taking electric charges. Therefore, the charged particle beam such as an electron beam is not influenced.

Second Embodiment

Figure 5:
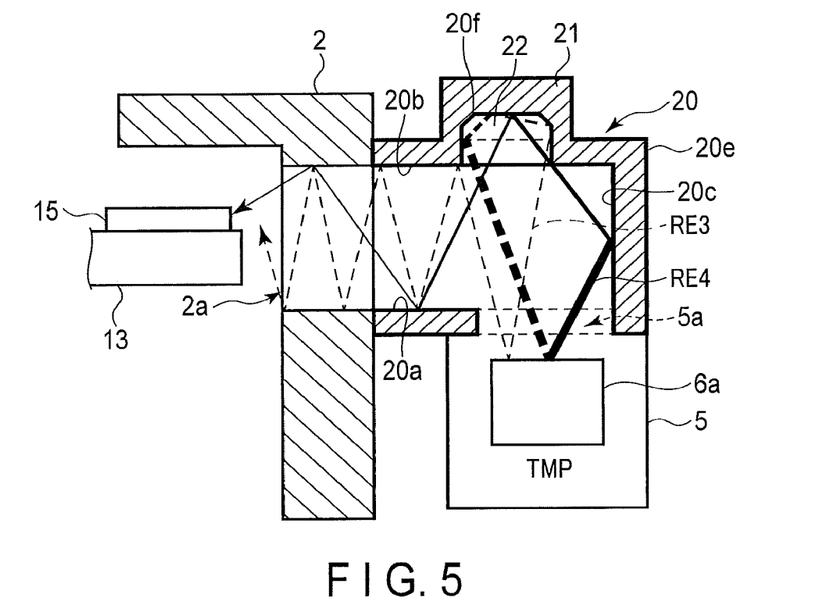
FIG. 5 schematically illustrates a portion of an electron beam writing apparatus according to a second embodiment.

A vacuum apparatus according to a second embodiment will be described below, taking an electron beam writing apparatus as an example. The exhaustion structure 21 of the electron beam writing apparatus according to the second embodiment differs in configuration from the exhaustion structure 4 of the electron beam writing apparatus according to the first embodiment described above. In the second embodiment, the same components of the electron beam writing apparatus as those of the electron beam writing apparatus according to the first embodiment are denoted by the same reference symbol, and their detailed description will be omitted. FIG. 5 illustrates a configuration of the exhaustion structure 21 attached to the chamber of the electron beam writing apparatus according to the second embodiment. The exhaustion structure 21 is configured to increase the number of times the thermal radiation is reflected by the wall of the exhaustion structure 21 having a layer 20 of high-emissivity material.

Like in the exhaustion structure 4 of the first embodiment, in the exhaustion structure 21 of the electron beam writing apparatus according to the second embodiment, the layer 20 of high-emissivity material is formed at least on the inner surface of the wall of the exhaustion structure 21, favorably on both the inner and outer surfaces of the wall. In the upper wall of the exhaustion structure 21, a concave section 22 is formed opposed to the inlet port 5a of the TMP 5. The concave section 22 has a plurality of faces. The concave section 22 contributes to the increase of the number of reflections of thermal radiation emitted from the TMP 5 in the exhaustion structure 21. The increase of the number of reflections means that the thermal radiation propagates into the chamber 2 after the energy of the thermal radiation is more decreased.

In the example of FIG. 5, the internal space of the concave section 22 is shaped like a chamfered box. It is not limited to the chamfered box, but may take various shapes such as a cylinder, a cone, a geometrical pyramid, a circular truncated cone, and a truncated pyramid. In addition, the upper angles of the wall of the exhaustion structure 21 in which the concave section 22 is formed, may be chamfered or rounded.

Next is a description of the mechanism of absorbing the energy of thermal radiation from the TMP 5 in the exhaustion structure 21 of the electron beam writing apparatus according to the second embodiment. As illustrated in FIG. 5, the thermal radiation emitted from the rotor 6a of the TMP 5 propagates upward through the inlet port 5a, as in the first embodiment. FIG. 5 shows propagation paths of two thermal radiations RE3 and RE4.

The thermal radiation RE3 emitted from the inlet port 5a is incident upon the side of the wall forming the concave section 22, and is reflected toward the top of the wall. As described above, the thermal radiation is reflected multiple times by a high-emissivity layer 20f formed in the inner surface of the wall to absorb the energy of the thermal radiation RE3 by the amount corresponding to the emissivity of the layer 20f. Accordingly, as the thermal radiation RE3 is reflected a plurality of times, the energy of the thermal radiation RE3 decreases. The thermal radiation RE3 is reflected by the sides and top of the wall of the concave section 22, and then propagates toward the inlet port 5a of the TMP 5. Since the energy of the thermal radiation RE3 is absorbed each time the thermal radiation RE3 is incident upon the high-emissivity layer 20f formed in the inner surface of the wall of the exhaustion structure 21, the thermal radiation RE3 whose energy has decreased propagates into the chamber 2.

The thermal radiation RE4 emitted from the rotor 6a of the TMP 5 is first incident upon a layer 20c formed on the side wall of the exhaustion structure 21 and is reflected toward the concave section 22 by the layer 20c. The thermal radiation RE4 is also reflected by the layer 20f formed on the inner surface of the upper wall of the concave section 22, then is incident upon a layer 20a formed on the inner surface of the bottom wall of the exhaustion structure 21, and is reflected upward by the layer 20a. The thermal radiation RE4 propagates through this path and is incident upon the high-emissivity layer 20 (20c, 20f and 20a) three times. Whenever the thermal radiation RE4 is incident upon the layer 20, its energy is absorbed by the amount corresponding to the emissivity of the layer 20 and thus reduced. Accordingly, the energy-reduced thermal radiation RE4 propagates into the chamber 2.

The energy of thermal radiations RE3 and RE4 absorbed by the layer 20 formed on the inner surface of the wall of the exhaustion structure 21 is conducted as heat toward the outer surface of the wall of the exhaustion structure 21. The heat of the wall of the exhaustion structure 21 is dissipated to the atmosphere from the outer surface of the wall, as has been described in the first embodiment.

In the electron beam writing apparatus according to the second embodiment, the concave section 22 is formed by the wall of the exhaustion structure 21 opposed to the inlet port 5a of the TMP 5. The electron beam writing apparatus of the second embodiment brings about the advantage that the thermal radiation propagating through the inlet port 5a is reflected in various directions by the walls forming the concave section 22, in addition to the above-described advantages of the first embodiment. Part of the thermal radiation does not propagate into the chamber 2 but remains in the exhaustion structure 21. Thus, since the energy amount of thermal radiation propagating into the chamber 2 can be more decreased, the amount of heat generated in the chamber 2 is more decreased.

First Modification to Second Embodiment

Next is a description of a first modification to the exhaustion structure 21 of the electron beam writing apparatus according to the second embodiment.

Figure 6:
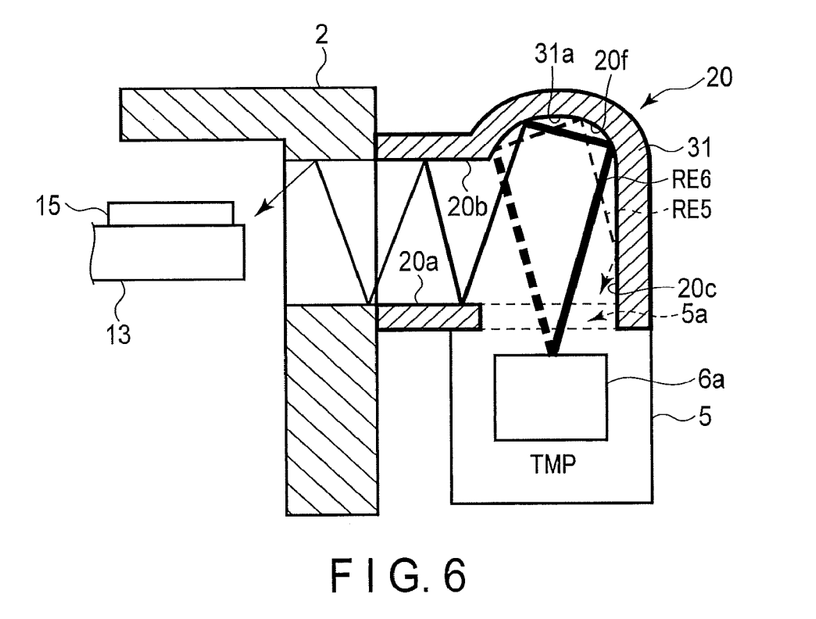
FIG. 6 is a schematic view of a first modification to an exhaustion structure in the electron beam writing apparatus according to the second embodiment.

FIG. 6 schematically shows a configuration of an exhaustion structure 31 according to the first modification. In the foregoing electron beam writing apparatus according to the second embodiment, the upper wall of the exhaustion structure 21 in which the concave section 22 is formed, is flat. In contrast, the upper wall of the exhaustion structure 31 is shaped like a dome. The propagation paths of thermal radiation in the exhaustion structure 31 according to the first modification will be described with reference to FIG. 6, taking two paths of thermal radiations RE5 and RE6 as examples.

In the first modification, the thermal radiation RE5 emitted from the inlet port 5a is incident upon a ceiling surface 31a that is a concave curved surface of the upper wall forming a dome of the exhaustion structure 31, and is reflected toward another area of the ceiling surface 31a. As described above, the ceiling surface 31a has a high-emissivity layer 20f formed on the inner surface of the wall. When the thermal radiation RE5 is incident upon the layer 20f, its energy is absorbed by the amount corresponding to the emissivity of the layer 20f. The energy amount of the thermal radiation RE5 reflected by the layer 20f decreases. The reflected thermal radiation RE5 is also reflected by the ceiling surface 31a (layer 20f) and then by the layer 20c formed on the side wall of the exhaustion structure 31. Finally, the thermal radiation RE5 propagates toward the inlet port 5a of the TMP 5. Whenever the thermal radiation RE5 is incident upon the high-emissivity layer 20 (20f, 20c), its energy is absorbed and gradually decreased.

The thermal radiation RE6 is incident upon the ceiling surface 31a of the upper wall of the exhaustion structure 31 and is reflected toward another area of the ceiling surface 31a in the direction towards the chamber 2. The thermal radiation RE6 is also reflected by the ceiling surface 31a and is incident upon the layer 20a formed on the bottom wall of the exhaustion structure 31. In the exhaustion structure 31, the thermal radiation RE6 is then reflected a plurality of times by the layer 20b of the upper wall and the layer 20a of the lower wall which are arranged in parallel, and propagates toward the chamber 2. In this first modification, the thermal radiation RE6 is incident upon the layer 20 (20f, 20a, 20b) four times. Each time the thermal radiation RE6 is incident upon the layer 20, its energy is absorbed by the amount corresponding to the emissivity of the layer 20 and gradually reduced. Accordingly, the energy-reduced thermal radiation RE6 propagates into the chamber 2.

As described above, the energy of thermal radiations RE5 and RE6 absorbed by the layer 20 formed on the inner surface of the wall of the exhaustion structure 31 is conducted as heat to the outer surface of the wall of the exhaustion structure 31 and dissipated to the atmosphere.

The exhaustion structure 31 according to the first modification brings about the advantage that is similar to that of the exhaustion structure 21 of the electron beam writing apparatus according to the second embodiment.

Furthermore, since the upper wall of the exhaustion structure 31 is shaped like a dome, the robustness of the exhaustion structure 31 increases. The wall of the exhaustion structure 31 can thus be thinned, with the result that the exhaustion structure 31 becomes light. In addition, the energy of the thermal radiation absorbed by the layer 20 formed on the wall of the exhaustion structure 31 is conducted to the outer surface of the wall with efficiency and then dissipated. The area of the outer surface of the exhaustion structure 31 whose upper wall is shaped like a dome is larger than that of the outer surface of each of the exhaustion structures 4 and 21 whose upper wall is flat. Accordingly, the efficiency of the heat dissipation is higher. In addition, the upper wall of the exhaustion structure 31 has a spherical outer surface. Thus, since the downflow of air flows more smoothly along the spherical surface than a flat surface, the upper wall is cooled with higher efficiency.

Second Modification to Second Embodiment

Next is a description of a second modification to the exhaustion structure 21 of the electron beam writing apparatus according to the second embodiment.

Figure 7:
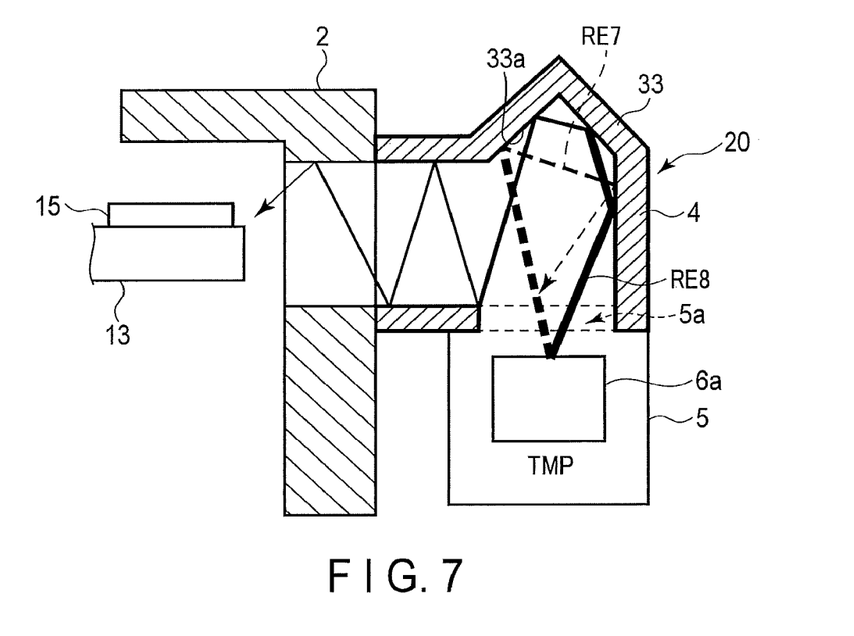
FIG. 7 is a schematic view of a second modification to the exhaustion structure in the electron beam writing apparatus according to the second embodiment.

FIG. 7 schematically shows a configuration of an exhaustion structure 33 according to the second modification. In the foregoing first modification, the upper wall of the exhaustion structure 31 is shaped like a dome. In the second modification, the upper wall of the exhaustion structure 33 is shaped like a cone or a geometrical pyramid. In FIG. 7, the propagation paths of thermal radiation from the inlet port 5a of the TMP 5 are shown, taking two paths of thermal radiations RE7 and RE8 as examples.

In the second modification, the thermal radiation RE7 emitted from the inlet port 5a is incident upon a high-emissivity layer 33a formed on the side of a cone of the exhaustion structure 33 and is reflected toward another area of the layer 33a. The thermal radiation RE7 is reflected by the layer 33a toward a layer 20 formed on the side wall of the exhaustion structure 33, and also reflected by the layer 20 on the side of the exhaustion structure 33, and propagates toward the inlet port 5a of the TMP 5. On the other hand, the thermal radiation RE8 is reflected by the layer 20, and also reflected by the layer 33a two times. The thermal radiation RE8 is then reflected multiple times by the layers 20 of the upper and lower walls of the exhaustion structure 33 which are arranged in parallel, and propagates toward the chamber 2.

In the exhaustion structure 33 according to the second modification, the thermal radiation RE7 is incident upon the layer 20, which is formed on the wall of the exhaustion structure 33, two times. Each time the thermal radiation RE7 is incident upon the layer 20, its energy is absorbed by the amount corresponding to the emissivity of the layer 20. Then, the thermal radiation RE7 does not propagate into the chamber 2 but remains in the exhaustion structure 33. On the other hand, the thermal radiation RE8 is incident upon the layer 20 several times. Each time the thermal radiation RE8 is incident upon the layer 20, its energy is absorbed by the amount corresponding to the emissivity of the layer 20. Then, the thermal radiation RE8 having reduced energy propagates into the chamber 2. In the exhaustion structure 33, the energy of thermal radiations RE7 and RE8 absorbed by the layer 20 formed on the inner surface of the wall is conducted as heat to the outer surface of the wall. This heat is dissipated to the atmosphere.

The exhaustion structure 33 according to the second modification brings about the advantage that is equivalent to that of the exhaustion structure 31 according to the first modification described above. Since, furthermore, the upper wall of the exhaustion structure 33 is shaped like a cone or a geometrical pyramid, the thermal radiation can be reflected two or more times within the cone of the upper wall. The thermal radiation can also be reflected in various directions. As a result, the energy of the thermal radiation can be absorbed with efficiency.

Third Embodiment

Figure 8:
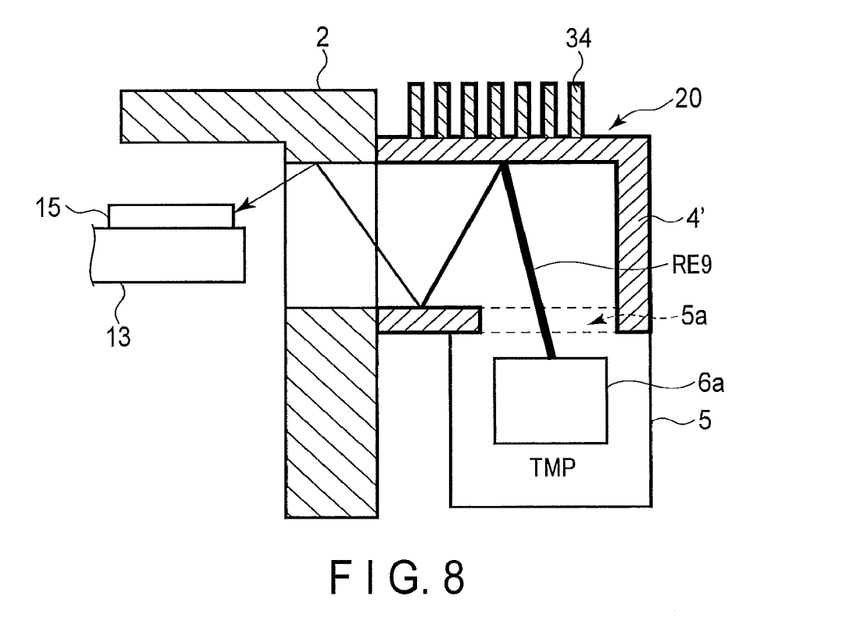
FIG. 8 schematically illustrates a portion of an electron beam writing apparatus according to a third embodiment.

Next is a description of an electron beam writing apparatus according to a third embodiment. The electron beam writing apparatus according to the third embodiment includes an exhaustion structure that differs in configuration from the exhaustion structures of the electron beam writing apparatuses according to the other embodiments. In the third embodiment, the same components of the electron beam writing apparatus as those of the electron beam writing apparatuses according to the other embodiments are denoted by the same reference symbol, and their detailed description will be omitted. FIG. 8 illustrates an exhaustion structure 4' attached to a chamber 2 according to the third embodiment and a turbo-molecular pump (TMP) 5 attached to the exhaustion structure 4'.

In the electron beam writing apparatus according to the third embodiment, a plurality of radiating fins are provided on the outer surface of the upper wall of the exhaustion structure 4' that corresponds to the exhaustion structure 4 of the electron beam writing apparatus 1 according to the first embodiment described above. Like in the foregoing exhaustion structure 4, in the exhaustion structure 4', a layer 20 of high-emissivity material is formed on the inner and outer surfaces of the wall of the exhaustion structure 4'. The layer 20 is also formed on the surfaces of the radiating fins.

As illustrated in FIG. 8, a plurality of thin, plate-like radiating fins 34 are arranged at regular intervals on the outer surface of the upper wall of the exhaustion structure 4'. In the third embodiment, the radiating fins 34 are so arranged that their radiating surfaces are parallel to the surface of the chamber 2 to which the exhaustion structure 4' is attached in order to cause a smooth downflow of air in a downstream direction. With the radiating fins 34 so arranged, the air passes between the radiating fins 34 and drops from both side ends of each of the radiating fins 34. Like the material of the exhaustion structure 4', the material of the radiating fins 34 may favorably be a high-conductivity aluminum alloy or copper alloy. The radiating fins 34 may be formed integrally with the wall of the exhaustion structure 4' by machining or may be attached to the wall of the exhaustion structure 4' by welding or the like.

The exhaustion structure 4' shown in FIG. 8 includes the radiating fins 34 only on the top of the upper wall thereof. However, the exhaustion structure 4' is not limited to this arrangement. The radiating fins 34 can be provided on the outer surfaces of three sides other than the side connected to the chamber 2, as well as on the top of the upper wall of the exhaustion structure 4'. The position in which the radiating fins 34 are attached to a surface of the wall can be selected in any suitable way. The number of surfaces of the wall to which the radiating fins are attached is also selectable. The size (or the surface area) of each of the radiating fins 34 may be set in accordance with the amount of thermal energy to be dissipated. The radiating surface of each of the radiating fins 34 is not limited to the flat surface but may be a wavy surface or an irregular surface (groove or projection).

As described above, in the exhaustion structure 4' of the electron beam writing apparatus according to the third embodiment, the energy of thermal radiation of the TMP 5 absorbed by the layer 20 is dissipated from the outer surface of the wall of the exhaustion structure 4', as in the foregoing exhaustion structure 4. Since, furthermore, the wall of the exhaustion structure 4' includes a plurality of radiating fins on its outer surface, it can be cooled with higher efficiency.

Fourth Embodiment

Figure 9:
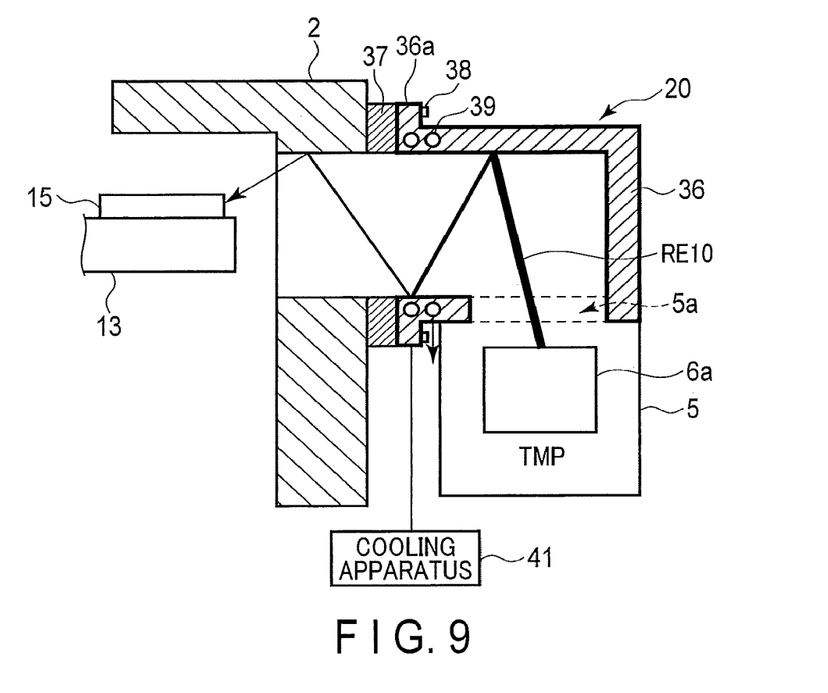
FIG. 9 schematically illustrates a portion of an electron beam writing apparatus according to a fourth embodiment.

Next is a description of an electron beam writing apparatus according to a fourth embodiment. This electron beam writing apparatus includes an exhaustion structure 36 having a different configuration. In the electron beam writing apparatus according to the fourth embodiment, the same components of the electron beam writing apparatus as those of the electron beam writing apparatuses according to the other embodiments are denoted by the same reference symbol, and their detailed description will be omitted. FIG. 9 illustrates the electron beam writing apparatus according to the fourth embodiment, including the exhaustion structure 36 attached to the chamber 2 and the TMP 5.

In the electron beam writing apparatuses according to the fourth embodiment, a heat insulating member 37 of low thermal conductivity (i.e. a member having heat insulation property) is provided between the chamber 2 and the exhaustion structure 36, unlike the foregoing exhaustion structure 4 according to the first embodiment. Accordingly, the heat of the wall of the exhaustion structure 36 is not conducted to the chamber 2.

Like the exhaustion structure 4 according to the first embodiment, a layer 20 of high-emissivity material is formed on the inner and outer surfaces of the wall of the exhaustion structure 36, as illustrated in FIG. 9. The heat insulating member 37 is provided between the exhaustion structure 36 and the chamber 2 to prevent heat from being conducted from the exhaustion structure 36 to the chamber 2. The heat insulating member 37 is formed of a material which is capable of maintaining the chamber 2 under vacuum. That is, it is required that the heat insulating member 37 prevent gas from leaking in under vacuum environment. It is also required that the rigidity of the heat insulating member 37 be high. When the heat insulating member 37 is formed of, e.g. metallic material, a stainless steel alloy, titanium and a titanium alloy, the thermal conductivity of which is low, may favorably be used. When the heat insulating member 37 is formed of nonmetallic material, quartz glass and ceramics may favorably be used. When the heat insulating member 37 is formed of resin material, polyether ether ketone resin (PEEK: registered trademark) and polyimide resin may favorably be used. The heat insulating member 37 may also be formed by the combination of any of the materials described above.

The above-described materials for the heat insulating member 37 include a material whose electric insulation property is high. Thus, when the heat insulating member 37 takes electric charges, the electric charges may influence electron beams. In the electron beam writing apparatus according to the fourth embodiment, to solve the above issue, the heat insulating member 37 may include a layer which has a low emissivity to prevent energy from being absorbed even though the layer receives thermal radiation and which is formed of a conductive material on the inner surface thereof. The surface of this conductive layer may be mirror-finished.

For example, the exhaustion structure 36 includes a flange 36a at its edge portion so that the heat insulating member 37 is interposed between the flange 36a and the chamber 2. The heat insulating member 37 is interposed between the flange 36a and the chamber 2, and the flange 36a and chamber 2 are fixed to each other by metallic bolts 38. Since the flange 36a and chamber 2 are fixed by the metallic bolts 38, they are electrically connected to each other and thus maintained at the same potential. Though not shown, seal members such as a gasket and an O-ring are provided between the chamber 2, heat insulating member 37 and flange 36a in order to maintain the chamber 2 and the exhaustion structure 36 air-tightly.

Furthermore, flow paths 39 are formed in the wall of the exhaustion structure 36 in the vicinity of the flange 36a. A coolant flows into the flow paths 39 from a cooling apparatus 41 to cool the wall of the exhaustion structure 36. In this embodiment, only the wall close to the flange 36a of the exhaustion structure 36 is cooled. The flow paths 39 may be disposed to cool the entire wall of the exhaustion structure 36. The reason why the electronic beam writing apparatus favorably includes the cooling apparatus 41 is that the exhaustion structure 36 may not be cooled sufficiently by the downflow of air depending upon the situation where the electron beam writing apparatus is installed. The cooling apparatus 41 and flow paths 39 can be applied to the foregoing electron beam writing apparatuses of the first to third embodiments and the first and second modifications to the second embodiment. Note that the flow paths 39 need not always be formed inside the wall of the exhaustion structure 36. The flow paths 39 may be arranged as pipes on the outer surface of the wall of the exhaustion structure 36.

According to the electron beam writing apparatus of the fourth embodiment, the wall of the exhaustion structure 36, the temperature of which is increased by absorbing the energy of thermal radiation from the TMP 5, is thermally separated from the chamber 2 by the heat insulating member 37. Accordingly, the influence of the thermal radiation generated from the TMP 5 upon the chamber 2 is more effectively suppressed. Since, furthermore, the wall of the exhaustion structure 36 is cooled by the cooling apparatus 41, the influence of the thermal radiation from the TMP 5 upon the chamber 2 is lessened.

Fifth Embodiment

Figure 10:
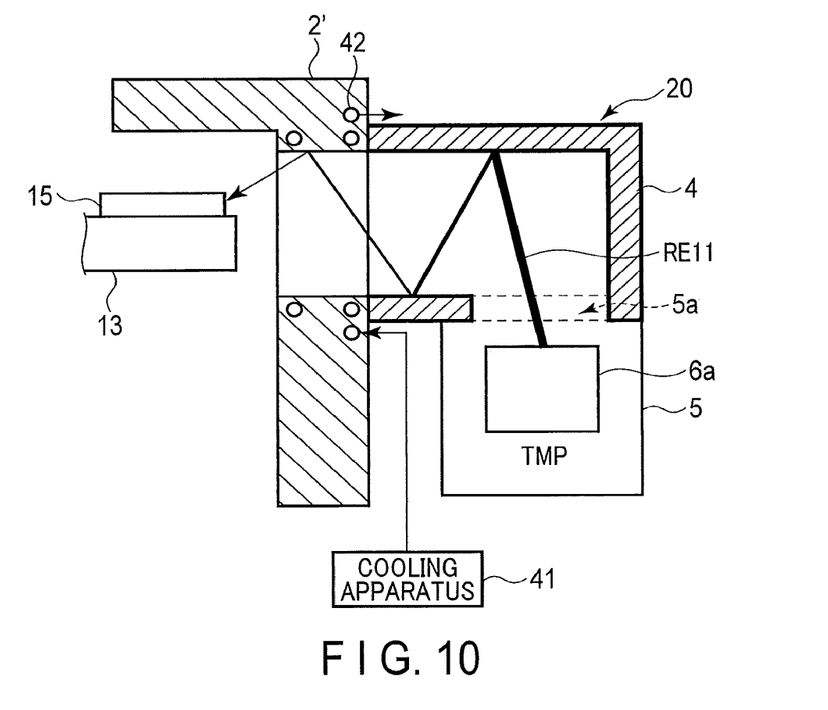
FIG. 10 schematically illustrates a portion of an electron beam writing apparatus according to a fifth embodiment.

Next is a description of an electron beam writing apparatus according to a fifth embodiment. The electron beam writing apparatus according to the fifth embodiment includes a chamber that differs in configuration from those of the electron beam writing apparatuses according to the other embodiments. In the electron beam writing apparatus according to the fifth embodiment, the same components as those of the electron beam writing apparatuses according to the other embodiments are denoted by the same reference symbol, and their detailed description will be omitted. FIG. 10 illustrates a chamber 2' of the electron beam writing apparatus according to the fifth embodiment, an exhaustion structure 4 attached to the chamber 2', and a turbo-molecular pump 5.

The electron beam writing apparatus according to the fifth embodiment includes the chamber 2' and the exhaustion structure 4 as described with respect to the first embodiment. As illustrated in FIG. 10, flow paths 42 in which a coolant flows are formed close to a portion of the chamber 2' to which the exhaustion structure 4 is attached. The coolant flows from a cooling apparatus 41 into the flow paths 42 to cool the chamber 2'. Since heat conducted to the chamber 2' from the wall of the exhaustion structure 4 is cooled by the coolant that the cooling apparatus 41 causes to flow through the flow paths 42, the influence of the heat upon the chamber 2' is more effectively suppressed.

In the electron beam writing apparatus according to the fifth embodiment, the heat conducted to the chamber 2' from the wall of the exhaustion structure 4 is cooled by the coolant, and thus the influence of the heat upon the chamber 2' is suppressed.

The present invention is not limited to the embodiments described above, and various modifications may be implemented without departing from the concept or scope of the present invention.

In the embodiments described above, descriptions for portions which are not directly necessary to explain the present invention, such as detailed configurations of devices and control methods, are omitted. However, it should be noted that the configurations of the devices and the control methods can be suitably selected and used if required. All inspection methods and inspection apparatuses that comprise the elements of the present invention and that can be suitably modified by a person ordinarily skilled in the art are encompassed in the scope of the present invention.

What is claimed is:

1. A vacuum apparatus comprising:
    a chamber;
    a vacuum pump configured to exhaust gas from the chamber; and
    an exhaustion structure placed between the chamber and an inlet port of the vacuum pump and having a ventilation path surrounded by a wall of the exhaustion structure,
    wherein:
    the vacuum pump exhausts gas from the chamber through the ventilation path of the exhaustion structure; and
    a layer of thermal energy absorbing material is formed on at least part of an inner surface of the wall of the exhaustion structure to absorb energy of thermal radiation emitted from the inlet port of the vacuum pump.

2. The vacuum apparatus according to claim 1, wherein the wall of the exhaustion structure is formed of material whose thermal conductivity is high to conduct the energy of thermal radiation absorbed by the thermal energy absorbing material and dissipate heat from an outer surface of the wall.

3. The vacuum apparatus according to claim 1, wherein:
    the wall of the exhaustion structure is formed to have a concave section on an inner surface opposed to the inlet port of the vacuum pump; and
    the inner surface of the wall of the exhaustion structure in which the concave section is formed is covered with the thermal energy absorbing material.

4. The vacuum apparatus according to claim 3, wherein the concave section of the wall of the exhaustion structure has an internal space that is shaped like one of a box, a cylinder, a dome, a cone, a geometrical pyramid, a circular truncated cone, and a truncated pyramid.

5. The vacuum apparatus according to claim 1, wherein the exhaustion structure includes a radiating fin on at least part of an outer surface of the wall.

6. The vacuum apparatus according to claim 1, further comprising a heat insulating member between the chamber and the wall of the exhaustion structure to prevent the energy of thermal radiation absorbed by the thermal energy absorbing material from being conducted to the chamber through the wall of the exhaustion structure.

7. The vacuum apparatus according to claim 6, wherein:
    an electric insulation member is provided for the heat insulating member between the chamber and the wall of the exhaustion structure; and
    the apparatus further comprises a conductor which electrically couples the chamber with the wall of the exhaustion structure.

8. The vacuum apparatus according to claim 1, further comprising:
    a flow path formed in the chamber close to the wall of the exhaustion structure for a flow of a coolant; and
    a cooling device configured to cause the coolant to flow through the flow path.

9. The vacuum apparatus according to claim 1, further comprising:
    a flow path formed in the wall of the exhaustion structure close to the chamber for a flow of a coolant in the wall of the exhaustion structure; and
    a cooling device configured to cause the coolant to flow into the flow path.

10. A charged particle beam writing apparatus comprising:
    a chamber;
    a stage which is provided movably in the chamber and on which a target object is placed;

a column placed on the chamber, and including a charged particle beam irradiation mechanism configured to irradiate the target object placed on the stage with a charged particle beam to write a pattern on the target object;

a vacuum pump configured to exhaust gas from the column and the chamber; and an exhaustion structure placed between the chamber and an inlet port of the vacuum pump and having a ventilation path surrounded by a wall of the exhaustion structure, wherein:

the vacuum pump exhausts gas from the chamber through the ventilation path of the exhaustion structure; and a layer of thermal energy absorbing material is formed on at least part of an inner surface of the wall of the exhaustion structure to absorb energy of thermal radiation emitted from the inlet port of the vacuum pump.

* * * * *